(12) United States Patent
Chen

(10) Patent No.: US 6,207,579 B1
(45) Date of Patent: Mar. 27, 2001

(54) METHOD OF FABRICATING SELF-ALIGNED NODE

(75) Inventor: Terry Chung-Yi Chen, Chung-Ho (TW)

(73) Assignee: United Micoelectronics Corp., Hsinchu (TW)

( * ) Notice: Subject to any disclaimer, the term of this patent is extended or adjusted under 35 U.S.C. 154(b) by 0 days.

(21) Appl. No.: 09/286,357

(22) Filed: Apr. 5, 1999

(30) Foreign Application Priority Data

Mar. 1, 1999 (TW) ................................................ 88103043

(51) Int. Cl.⁷ ............................................... H01L 21/3065
(52) U.S. Cl. .......................... 438/706; 438/720; 438/721; 438/723; 438/724
(58) Field of Search ..................... 438/699, 696, 438/700, 723, 724, 255, 244, 720, 721, 742, 743

(56) References Cited

U.S. PATENT DOCUMENTS

| | | | | |
|---|---|---|---|---|
| 5,362,666 | * | 11/1994 | Dennison | 438/396 |
| 5,641,694 | * | 6/1997 | Kenny | 438/156 |
| 5,858,831 | * | 1/1999 | Sung | 438/241 |
| 5,858,837 | * | 1/1999 | Sakoh et al. | 438/255 |
| 5,936,272 | * | 8/1999 | Lee | 257/306 |

* cited by examiner

Primary Examiner—Benjamin L. Utech
Assistant Examiner—Binh X. Tran
(74) Attorney, Agent, or Firm—Jiawei Huang; J. C. Patents

(57) ABSTRACT

A method of fabricating a self-aligned storage node is described. A storage node plug is formed after formations of the bit line contact and the storage node contact. A spacer is formed on a sidewall of an opening, which is used for forming a bit line. The bit line is formed in the opening. Because the spacer provides good isolation, the tolerance window for forming the bit line is increased. Some follow-up steps are performed to form a storage node.

20 Claims, 6 Drawing Sheets

METHOD OF FABRICATING SELF-ALIGNED NODE

CROSS-REFERENCE TO RELATED APPLICATION

This application claims the priority benefit of Taiwan application serial. no. 88103043, filed Mar. 1, 1999.

BACKGROUND OF THE INVENTION

1. Field of the Invention

The present invention relates to a semiconductor fabricating method. More particularly, the present invention relates to a method of fabricating a self-aligned storage node.

2. Description of the Related Art

Because the function of a microprocessor becomes more powerful and its software program becomes more complicated, there is a correspondingly greater need for a high-capacity DRAM. As the integration of the DRAM increases, a memory cell, which comprises a transfer field effect transistor (TFET) and a storage capacitor, is commonly used.

As the DRAM integration increases, the size of a DRAM capacitor must be decreased. In order to maintain the capacity of the capacitor, the surface area of the capacitor must be increased. Thus, a stacked capacitor has been developed.

According to the fabrication process, the stacked capacitors are separated into two types: capacitor over bit line (COB) and capacitor under bit line (CUB). As the DRAM integration increases, an overlay margin between the storage node contact of the COB and the bit line is reduced. In order to provide sufficient space for forming the storage node contact, the width between the storage node contact and the bit line must be decreased as much as possible. This, in turn, causes difficulties in fabricating bit lines and may also break the bit lines.

SUMMARY OF THE INVENTION

The invention provides a method of fabricating a self-aligned storage node. A first insulating layer is formed on a substrate. A preserve layer is formed on the first insulating layer. A bit line contact and a storage node contact are formed in the preserve layer and the first insulating layer. The bit line contact and the storage node contact are in contact with a source/drain region in the substrate. A second insulating layer is formed to cover the bit line contact, the storage node contact, and the preserve layer. A storage node plug and a cap layer are formed in a second insulating layer. The cap layer is formed on the storage node plug. The storage node plug connects to the storage node contact. The second insulating layer is patterned to form a first opening that exposes the bit line contact. In order to provide a good isolation between a bit line formed in a subsequent step and the storage node contact, a spacer is formed on a sidewall of the first opening. The spacer isolates the bit line from the storage node contact. Thus, problems caused by overlap margin between the bit line and the storage node plug do not occur. Then, a bit line is formed in the opening to make contact with the bit line contact. A third insulating layer is formed to cover the second insulating layer and the bit line. The third insulating layer, the cap layer, and the second insulating layer are patterned to form a second opening exposing the storage node contact. A conductive layer is formed in the second opening.

In the invention, because the storage node plug is formed before the formation of the bit line, there is a sufficient space for forming the storage node plug. The storage node plug and the storage node contact are together used as a contact. That is, the contact is formed by first forming the storage node contact, and then forming the storage node plug. Thus, it resolves difficulties in forming the contact with a high aspect ratio. The tolerance window for forming the bit line is increased. There is no additional mask for forming the bit line in the present invention. Thus, it simplifies the fabrication process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
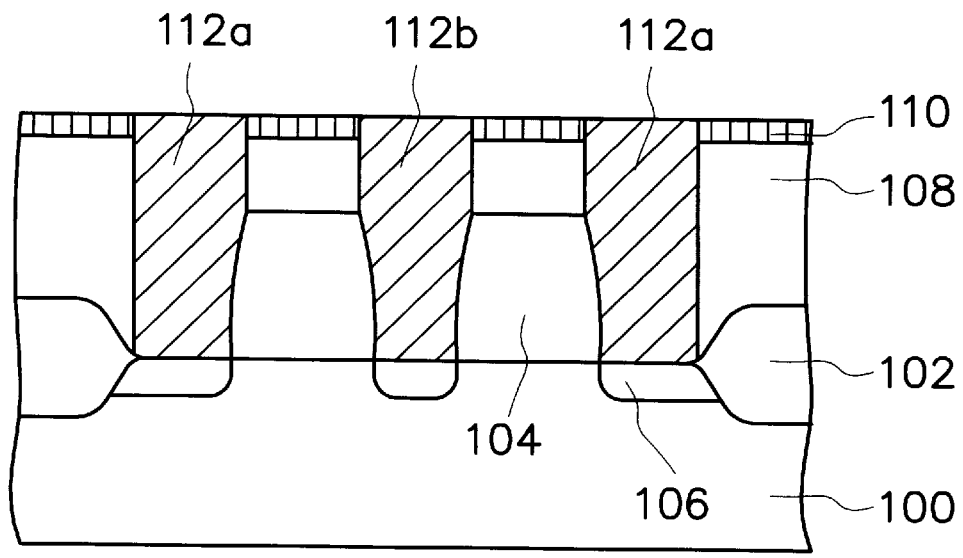
FIGS. 1 through 8 are schematic, cross-sectional views showing a method of fabricating a self-aligned storage node of a DRAM according to one preferred embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1 through 8 are schematic, cross-sectional views showing a method of fabricating a self-aligned storage node of a DRAM according to one preferred embodiment of the invention.

In FIG. 1, a substrate 100 including a variety of devices, such as an isolation layer 102, gates 104, and source/drain regions 106, is provided. The isolation layer 102 can be, for example, a field oxide layer. Each of the gates 104 comprises a gate oxide (not shown) layer, a gate conductive layer (not shown), a cap layer (not shown), and a spacer (not shown). It is appreciated that the gates 104 are well known to those skilled in the art, so these steps in forming the gates 104 and the structure of the gates 104 are not here described in detail. A first insulating layer 108 is formed over the substrate 100. The first insulating layer 108 can be a silicon oxide layer, for example. A first preserve layer 110 is formed on the first insulating layer 108. The first preserve layer 110 can be a silicon nitride layer, for example. Storage node contacts 112a and a bit line contact 112b are formed in the preserve layer 110 and the first insulating layer 108 to make contact with the source/drain regions 106. The preferred embodiment takes two storage node contacts 112a and one bit line contact 112b as an example. However, the present invention is not limited to two storage node contacts 112a and one bit line contact 112b. If desired, the amount of storage node contacts 112a and bit line contact 112b can be altered according to the requirements. The storage node contacts 112a and the bit line contact 112b can be formed by the following exemplary steps. A photolithographic and etching process is performed. The first preserve layer 110 and the first insulating layer 108 are patterned. Openings are formed in the first preserve layer 110 and the first insulating layer 108 to expose source/drain regions 106. A first conductive layer (not shown), such as a polysilicon layer, is formed over the substrate 100 to fill the opening. A chemical-mechanical polishing process or an etching back process is performed to remove the first conductive layer on the first preserve layer 110. The storage node contacts 112a and the bit line contact 112b thus are formed.

Figure 2:
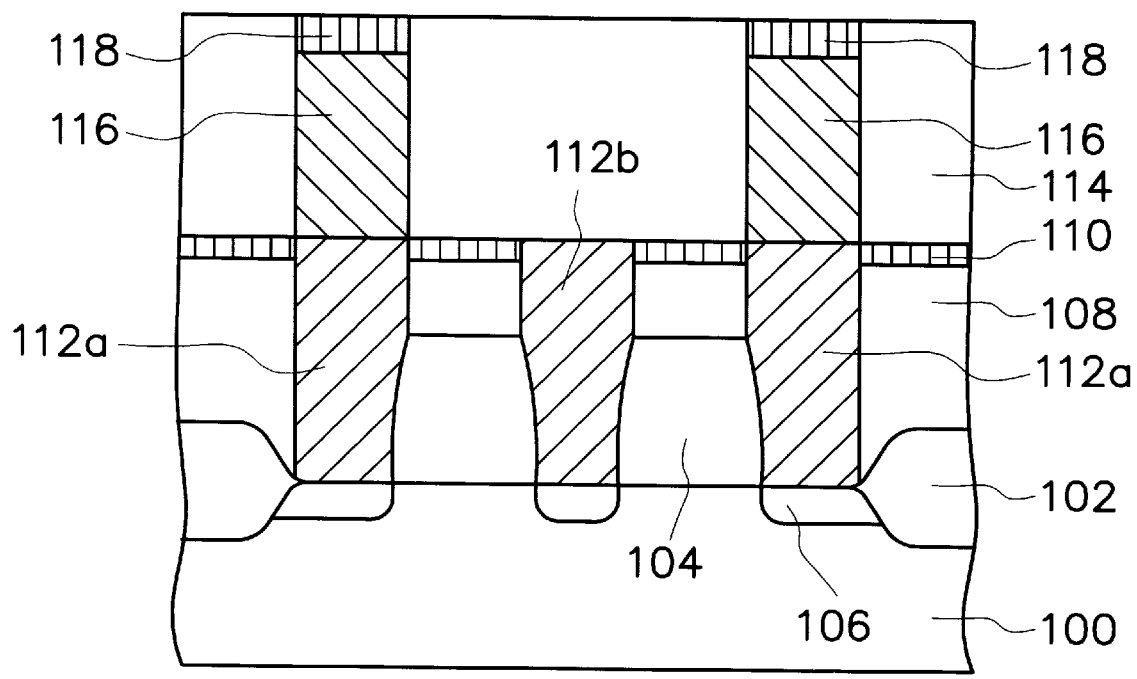

In FIG. 2, a second insulating layer 114, such as a silicon oxide layer, is formed over the substrate 100. Storage node plugs 116 and cap layers 118 are formed in the second insulating layer 114. Each of the cap layers 118 is formed on each of the storage node plugs 116. Each storage node plug 116 connects to the storage node contact 112a. The storage node plugs 116 and the cap layers 118 can be formed in the following exemplary steps. A photolithographic and etching process is performed. The second insulating layer 114 is patterned to form openings. A second conductive layer (not shown), such as a polysilicon layer, is formed over the substrate 100 to fill the openings in the second insulating layer 114. An etching back step is performed to remove the second conductive layer until the surface of the insulating layer 114 is a little lower than the second conductive layer. The remaining second conductive layer is used as the storage node plugs 116. A depth of the openings is reserved for forming the cap layers 118. A second preserve layer (not shown), such as a silicon nitride layer or a silicon-oxy-nitride layer, is formed on the insulating layer 114 to fill the openings. A chemical-mechanical polishing process or an etching back process is performed. The second preserve layer on the second insulating layer 114 is removed. The cap layers 118, which remains from the second preserve layer, are formed on the storage node plugs 116. In the invention, because the storage node plugs 116 are formed before the formation of the bit line (shown in FIG. 6), there is a sufficient space for forming the storage node plugs 116.

The storage node plug 116 and the storage node contact 112a are together used as a contact. That is, the contact is formed by first forming the storage node contact 112a, and then forming the storage node plug 116. Because the contact is formed by the two foregoing steps, it resolves difficulties in forming the contact with a high aspect ratio.

Figure 3:
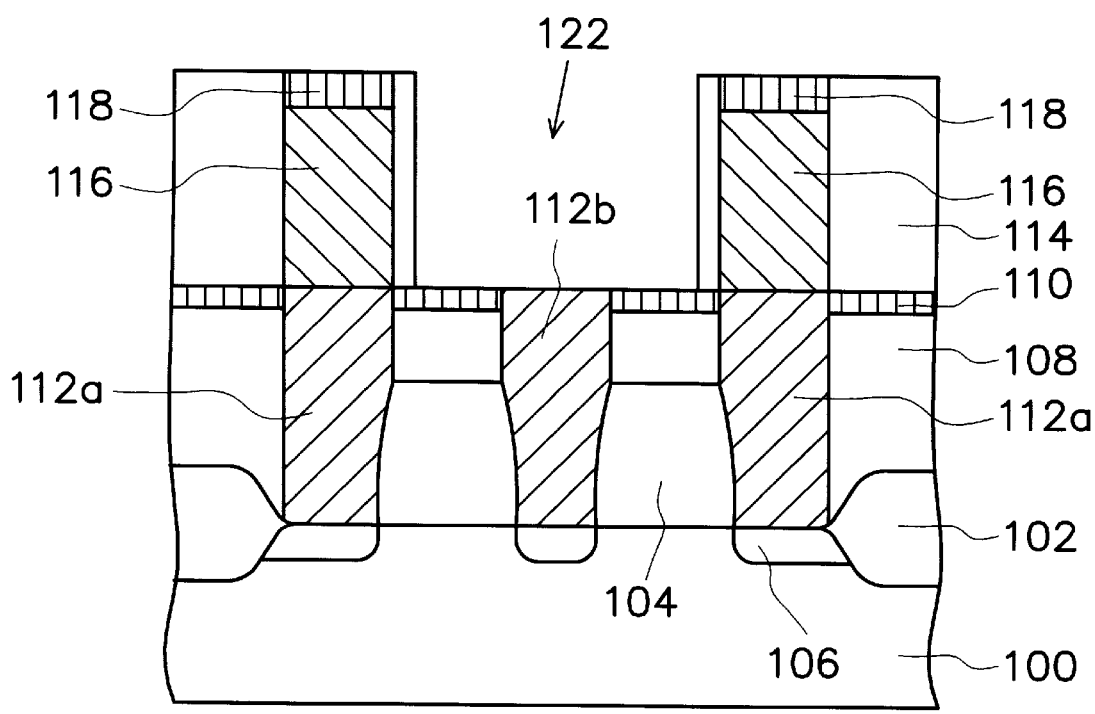

In FIG. 3, an opening 122 is formed through the insulating layer 114 to expose the bit line contact 112b by, for example, a photolithographic and etching process. The preferred width of the opening 122 is approximately the same as a distance between the storage node plugs 116.

Figure 4:
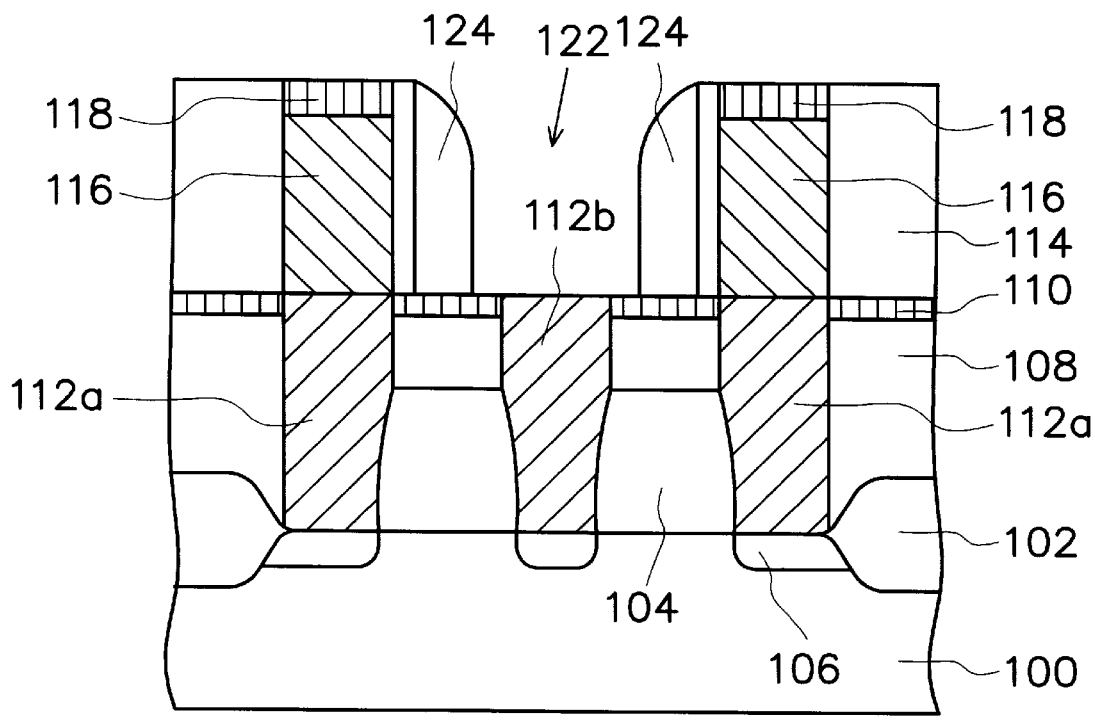

In FIG. 4, a spacer 124 is formed on a sidewall of the opening 122. The spacer 124 can be formed by the following exemplary steps. A conformal silicon nitride layer (not shown) or a conformal silicon oxide layer (not shown) is formed on the insulating layer 114 and in the opening 122. An anisotropic etching is performed on the silicon nitride layer or the silicon oxide layer to form the spacer 124. The spacer 124 isolates the storage node contact 116 from the bit line 126a. Because the spacer 124 provides good isolation between the bit line 126a (shown in FIG. 6) and the storage node contact 116, it resolves the problems caused by a overlap margin between the bit line 126a and the storage node plug 116. In addition, the tolerance window for forming the bit line 126a is increased.

Figure 5:
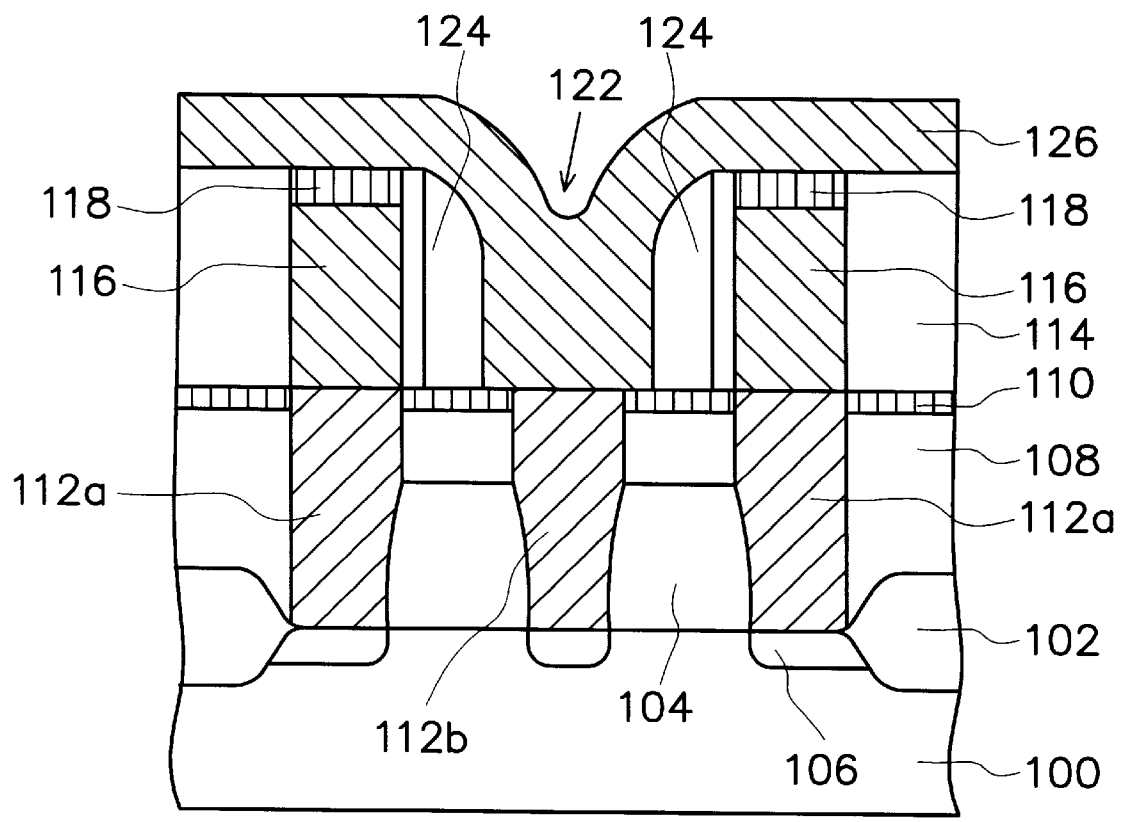

In FIG. 5, a third conductive layer 126 is formed over the insulating layer 114 to fill the opening 122 by, for example, chemical vapor deposition. The material of the third conductive layer 126 can be, for example, tungsten (W) and polycide, which include polysilicon and silicide. The thickness of the third conductive layer 126 must be sufficient for following etching.

Figure 6:
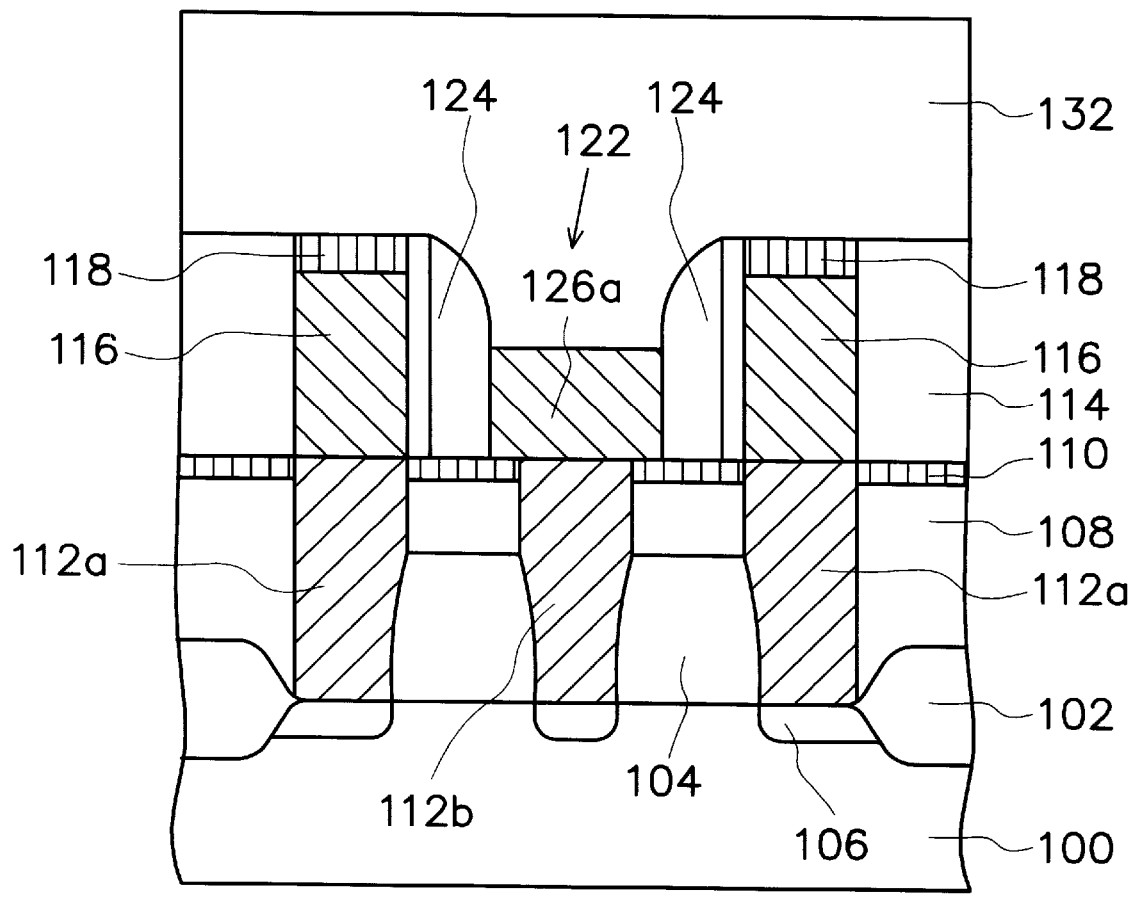

In FIG. 6, an etching back process is performed to remove a portion of the third conductive layer 126 to leave the other portion of the third conductive layer 126 in the opening 122. The remaining conductive layer in the opening 122 serves as a bit line 126a. In the etching process, there are a high etching selectivity between the third conducive layer 126 and the insulating layer 114 and a high etching selectivity between the third conductive layer 126 and the preserve layer 118. The bit line 126a is formed after the etching process. Therefore, it is not necessary to use additional mask for forming the bit line 126a. Moreover, the invention controls the resistance of the bit line 126a by controlling the thickness of the bit line 126a. It is important that the bit line 126a must be thinner than the storage node plugs 116 in order to benefit the following fabrication process. A third insulating layer 132, such as a silicon oxide layer, is formed over the substrate 100.

Figure 7:
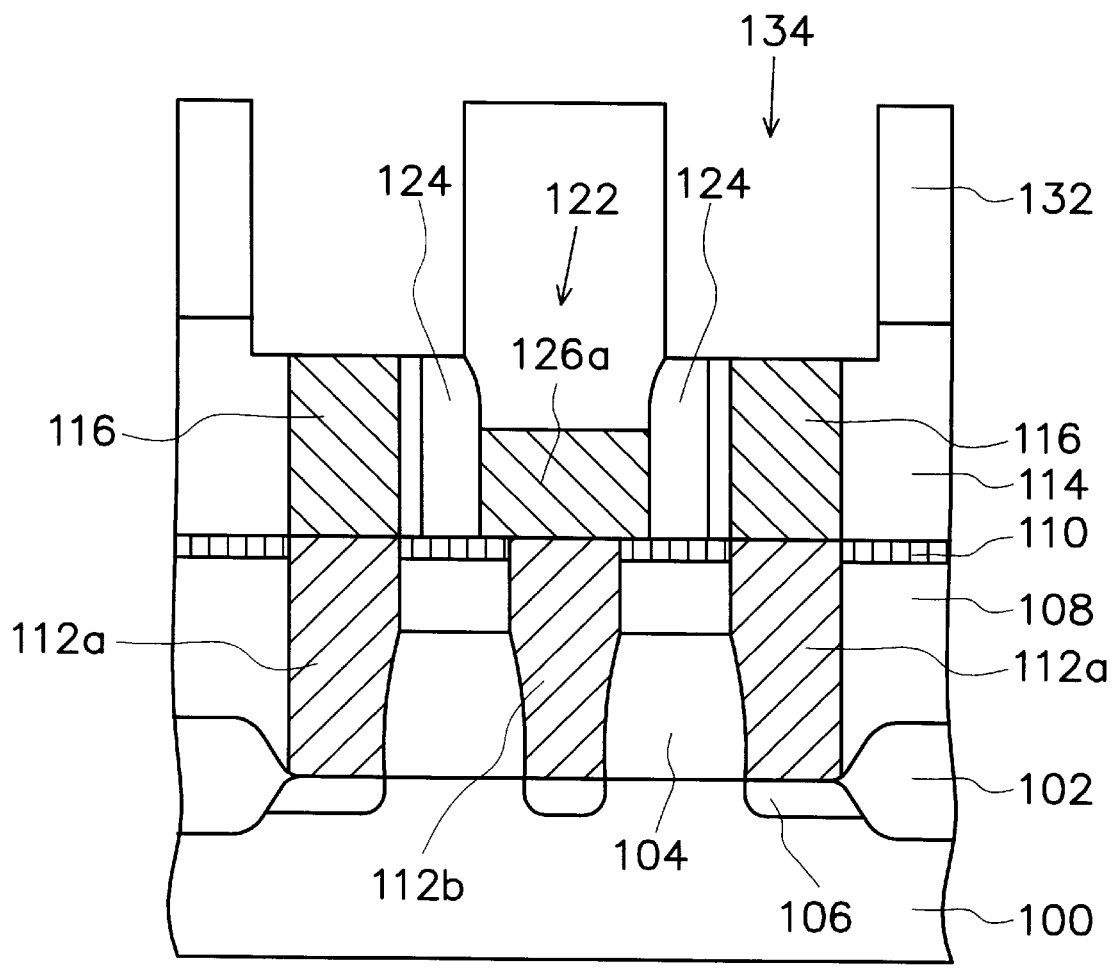

FIG. 7, a photolithographic and etching process is performed. The third insulating layer 132, the cap layer 118, and the second insulating layer 114 are pattered by, for example, anisotropic etching. Openings 134 are formed through the third insulating layer 132. Each opening 134 exposes the storage node plugs 116.

Figure 8:
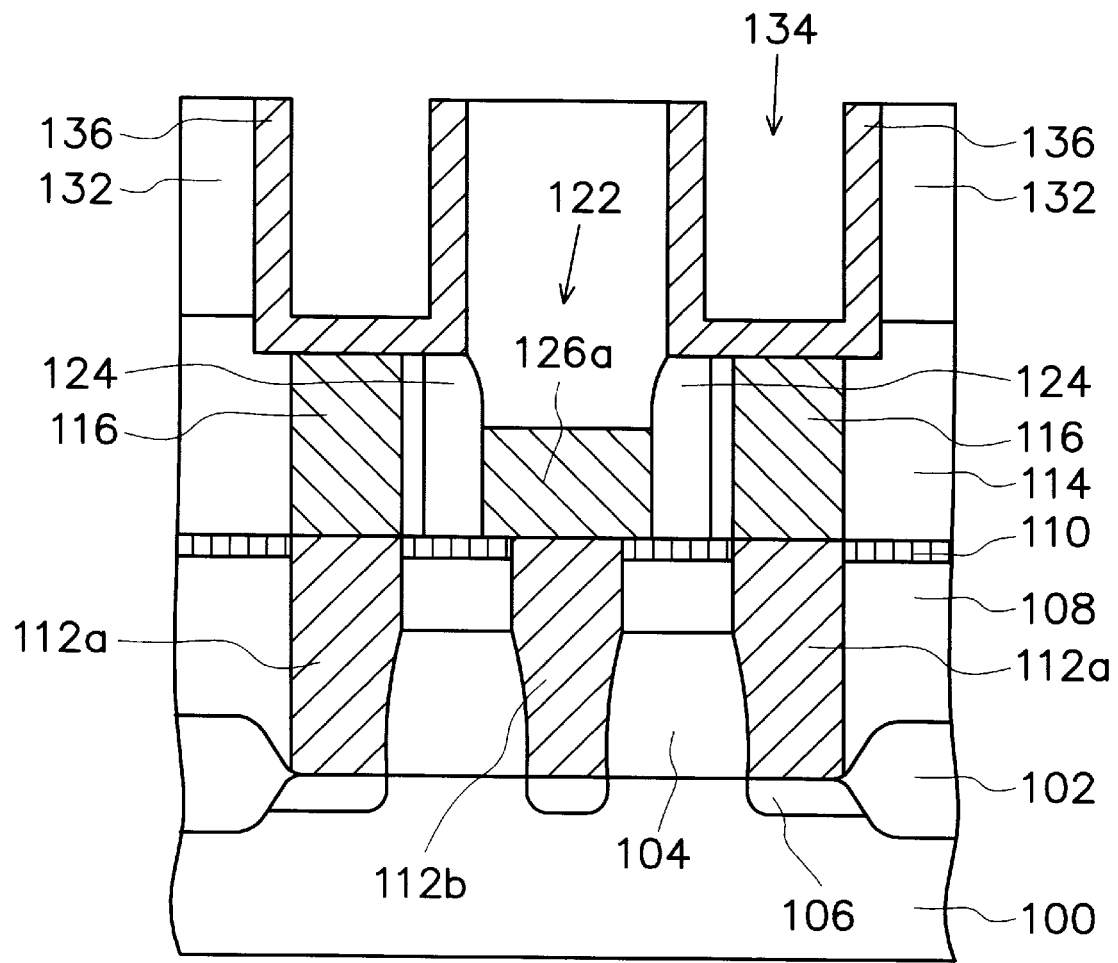

In FIG. 8, a conformal conductive layer 136 is formed in each of the openings 134. The conformal conductive layer 136 is used as a storage node. A dielectric layer (not shown) and a top electrode (not shown) are formed in sequence over the substrate 100 to complete a capacitor (not shown).

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a self-aligned storage node, comprising steps of:

forming a first insulating layer on a substrate;

forming a preserve layer on the first insulating layer;

forming a bit line contact and a storage node contact in the preserve layer and the first insulating layer, wherein the bit line contact and the storage node contact are in contact with a source/drain region in the substrate;

forming a second insulating layer on the bit line contact, the storage node contact, and the preserve layer;

forming a storage node plug and a cap layer in a second insulating layer, wherein the cap layer is formed on the storage node plug, and the storage node plug connects to the storage node contact;

patterning the second insulating layer to form a first opening that exposes the bit line contact;

forming a spacer on a sidewall of the first opening;

forming a bit line in the opening to make contact with the bit line contact;

forming a third insulating layer to cover the second insulating layer and the bit line; and patterning the third insulating layer, the cap layer, and the second insulating layer to form a second opening exposing the storage node contact; and forming a first conductive layer in the second opening.

2. The method of claim 1, wherein the first insulating layer comprises a silicon oxide layer.

3. The method of claim 1, wherein the second insulating layer comprises a silicon oxide layer.

4. The method of claim 1, wherein a material of the storage node plug comprises polysilicon.

5. The method of claim 1, wherein a material of the cap layer comprises silicon nitride.

6. The method of claim 1, wherein a material of the cap layer comprises silicon-oxy-nitride.

7. The method of claim 1, wherein the spacer comprises a silicon oxide layer.

8. The method of claim 1, wherein the spacer comprises silicon nitride layer.

9. The method of claim 1, wherein the steps of forming the bit line in the opening comprises:

forming a second conductive layer on the second insulating layer to fill the opening; and etching back the second conductive layer to leave a portion of the second conductive layer, wherein a surface of a remaining second conductive layer is lower than the surface of the second insulating layer.

10. The method of claim 9, wherein a material of the bit line comprises tungsten.

11. The method of claim 9, wherein a material of the bit line comprises polycide.

12. A method of fabricating a bit line, comprising steps of:

forming a first insulating layer on a substrate;

forming a preserve layer on the first insulating layer;

forming a bit line contact and a storage node contact only in the preserve layer and the first insulating layer, wherein the bit line contact and the storage node contact are in contact with source/drain region in the substrate;

forming a second insulating layer to cover the bit line contact, the storage node contact, and the preserve layer;

forming a storage plug in the second insulating layer, wherein a cap layer is formed on the storage node plug, and the storage plug connects to the storage node contact;

patterning the second insulating layer to form a first opening that exposes the bit line contact, wherein the cap layer protects the storage node plug from being etched;

forming a spacer on a sidewall of the first opening; and forming the bit line in the opening to make contact with bit line contact, wherein the spacer provides an isolation function in between the bit line and the storage node plug.

13. The method of claim 12, wherein a material of the storage node plug comprises polysilicon.

14. The method of claim 12, wherein a material of the cap layer comprises silicon nitride.

15. The method of claim 12, wherein a material of the cap layer comprises silicon-oxy-nitride.

16. The method of claim 12, wherein the spacer comprises a silicon oxide layer.

17. The method of claim 12, wherein the spacer comprises a silicon nitride layer.

18. The method of claim 12, wherein the steps of forming the bit line in the opening comprises:

forming a conductive layer on the second insulating layer to fill the opening; and etching back the conductive layer to leave a portion of the conductive layer, wherein a surface of a remaining conductive layer is lower than the surface of the second insulating layer.

19. The method of claim 18, wherein a material of the bit line comprises tungsten.

20. The method of claim 18, wherein a material of the bit line comprises polycide.

* * * * *